(12) United States Patent
Singh et al.

(10) Patent No.: US 12,711,298 B2
(45) Date of Patent: Aug. 18, 2026

(54) PRE-PLACEMENT CLOCKING IDENTIFICATION AND RESOLUTION FOR CIRCUIT DESIGNS

(71) Applicant: Xilinx, Inc., San Jose, CA (US)

(72) Inventors: Veeresh Pratap Singh, Hyderabad (IN); Padala V Santhosh, Hyderabad (IN); Srinivasan Dasasathyan, Secunderabad (IN)

(73) Assignee: Xilinx, Inc., San Jose, CA (US)

( * ) Notice: Subject to any disclaimer, the term of this patent is extended or adjusted under 35 U.S.C. 154(b) by 754 days.

(21) Appl. No.: 18/184,923

(22) Filed: Mar. 16, 2023

(65) Prior Publication Data

US 2024/0311541 A1 Sep. 19, 2024

(51) Int. Cl.
*G06F 119/12* (2020.01)
*G06F 30/392* (2020.01)
*G06F 30/396* (2020.01)

(52) U.S. Cl.
CPC .................................. *G06F 30/392* (2020.01)

(58) Field of Classification Search
CPC ... G06F 30/392; G06F 2119/12; G06F 30/396
See application file for complete search history.

(56) References Cited

U.S. PATENT DOCUMENTS

| | | | | |
|---|---|---|---|---|
| 10,289,775 | B1 * | 5/2019 | Wilson | G06F 30/394 |
| 10,614,261 | B1 * | 4/2020 | Alexander | G06F 30/396 |
| 10,860,761 | B1 * | 12/2020 | Vanukuri | G06F 30/396 |
| 2019/0064872 | A1 * | 2/2019 | Bourgeault | G06F 30/3312 |
| 2019/0140647 | A1 * | 5/2019 | Lim | H03K 19/17704 |

OTHER PUBLICATIONS

Versal ACAP Clocking Resources, Architecture Manual, AM003 (v1.4) May 24, 2022 Xilinx, 121 pages.

Versal ACAP Hardware, IP, and Platform Development Methodology Guide, UG1387 (v2022.2) Nov. 16, 2022, 109 pages.

* cited by examiner

*Primary Examiner* — Nghia M Doan
(74) *Attorney, Agent, or Firm* — Kevin T. Cuenot

(57) ABSTRACT

Preplacement clock resolution for implementing a circuit design includes, prior to placement of the circuit design, determining, using computer hardware, pairs of clocks of the circuit design that clock synchronous inter-clock data paths. Using the computer hardware, a clock group is generated that includes clocks having a common ancestor clock node from the pairs of clocks. A clock delay group property is set, using the computer hardware, for the clocks of the clock group prior to placement. A placed version of the circuit design is generated using the computer hardware. The circuit design is placed using the clock delay group property as set for the clocks of the clock group.

17 Claims, 5 Drawing Sheets

FIG. 5

PRE-PLACEMENT CLOCKING IDENTIFICATION AND RESOLUTION FOR CIRCUIT DESIGNS

TECHNICAL FIELD

This disclosure relates to integrated circuits (ICs) and, more particularly, to implementing circuit designs that include synchronous inter-clock signal paths within ICs.

BACKGROUND

Conventional circuit design implementation techniques employ a strategy in which the circuit design is placed. Subsequent to placement, an analysis is performed to identify timing critical paths. The timing critical paths may have setup violations or hold violations that arise due, at least in part, to clock skew. In many cases, the timing criticality arises due to clock delay mismatches between the clocks driving the sources and the loads of nets of the circuit design.

One cause of the delay mismatches occurs with respect to nets that are considered synchronous inter-clock signal paths. A synchronous inter-clock signal path refers to a net that has a source clocked by a first clock signal and a sink clocked by a second and different clock signal. Though different, the two clock signals originate from the same clock source. That is, the two clock signals are said to have a common ancestor clock node. An example of an ancestor clock node is a clock generator that generates both clock signals.

During the placement phase, placers may attempt to match the delays of the source clock path and the destination clock path for nets determined to be synchronous inter-clock signal paths. Conventional circuit design implementation techniques, however, are often unable to adequately address the clock skew issues that arise with such data paths.

SUMMARY

In one or more example implementations, a method includes, prior to placement of a circuit design, determining, using computer hardware, pairs of clock signals of the circuit design. The pairs of clock signals are formed of clock signals used to clock synchronous inter-clock data paths of the circuit design. The method includes generating, using the computer hardware, a clock group that includes clock signals having a common ancestor clock node from the pairs of clocks. The method includes setting, using the computer hardware, a clock delay group property for the clock signals of the clock group prior to placement. The method includes generating a placed version of the circuit design by placing, using the computer hardware, the circuit design using the clock delay group property as set for the clock signals of the clock group.

The foregoing and other implementations can each optionally include one or more of the following features, alone or in combination. Some example implementations include all the following features in combination.

In some aspects, the method includes detecting nets of the circuit design that are synchronous inter-clock data paths.

In some aspects, each pair of clock signals includes a first clock signal configured to clock a first endpoint of a net and a second clock signal configured to clock a second endpoint of the net.

In some aspects, each pair of clock signals shares a common ancestor clock node.

In some aspects, setting the clock delay group property forces a common location for a clock root of each clock signal of the clock group.

In some aspects, during the placing, clock routing delays for the clock signals of the clock group are matched based on the respective clock roots of the clock signals of the clock group.

In some aspects, the clock routing delays are determined from a clock buffer of each clock signal to the clock root for each clock signal.

In one or more example implementations, a system includes one or more hardware processors configured (e.g., programmed) to initiate and/or execute operations as described within this disclosure.

In one or more example implementations, a computer program product includes one or more computer readable storage mediums having program instructions embodied therewith. The program instructions are executable by computer hardware, e.g., a hardware processor, to cause the computer hardware to initiate and/or execute operations as described within this disclosure.

This Summary section is provided merely to introduce certain concepts and not to identify any key or essential features of the claimed subject matter. Other features of the inventive arrangements will be apparent from the accompanying drawings and from the following detailed description.

BRIEF DESCRIPTION OF THE DRAWINGS

The inventive arrangements are illustrated by way of example in the accompanying drawings. The drawings, however, should not be construed to be limiting of the inventive arrangements to only the particular implementations shown. Various aspects and advantages will become apparent upon review of the following detailed description and upon reference to the drawings.

FIG. 5 illustrates another example of an IC in which a preplacement processing technique is applied.

DETAILED DESCRIPTION

Figure 1:
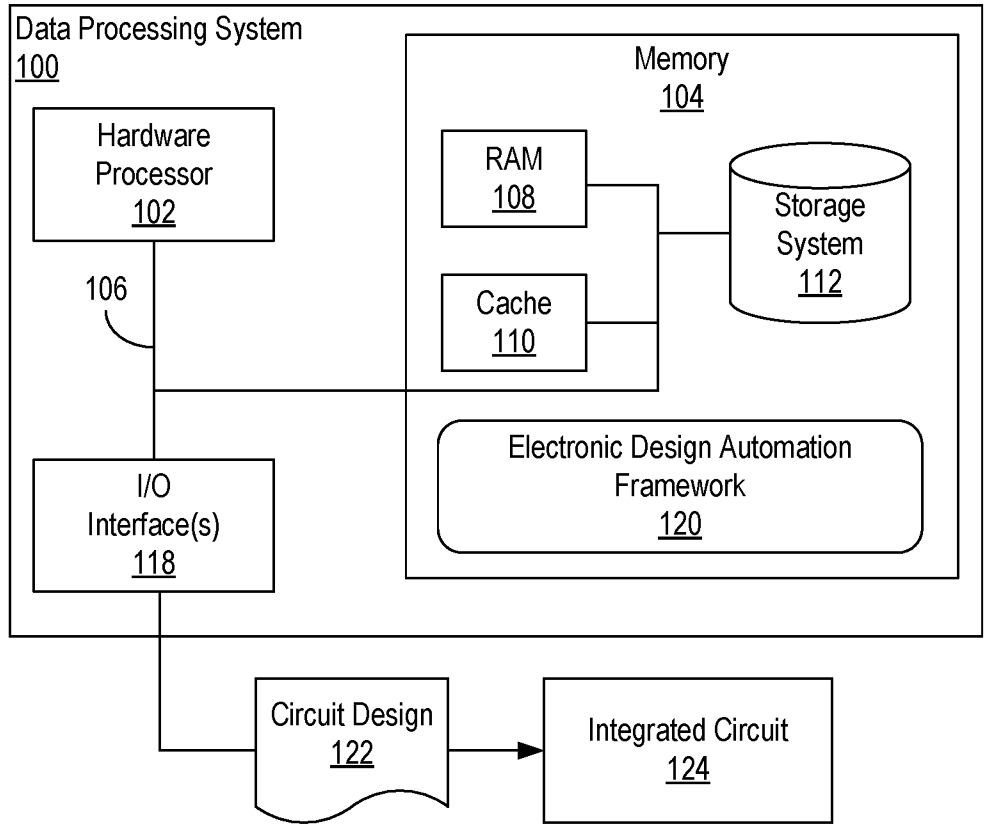
FIG. 1 illustrates an example of a data processing system for use with one or more embodiments described herein.

While the disclosure concludes with claims defining novel features, it is believed that the various features described within this disclosure will be better understood from a consideration of the description in conjunction with the drawings. The process(es), machine(s), manufacture(s) and any variations thereof described herein are provided for purposes of illustration. Specific structural and functional details described within this disclosure are not to be interpreted as limiting, but merely as a basis for the claims and as a representative basis for teaching one skilled in the art to variously employ the features described in virtually any appropriately detailed structure. Further, the terms and phrases used within this disclosure are not intended to be limiting, but rather to provide an understandable description of the features described.

This disclosure relates to integrated circuits (ICs) and, more particularly, to implementing circuit designs that include synchronous inter-clock signal paths within ICs. Methods, systems, and computer program products are provided that address timing issues that arise when implementing circuit designs including selected types of nets referred to as synchronous inter-clock data paths. The techniques described herein may be performed, within the context of a design flow, prior to placement of the circuit design to address clock skew issues that may arise with respect to synchronous inter-clock data paths. By incorporating the circuit design techniques described herein and doing so prior to placement of the circuit design, an improved quality of result (QoR) for the circuit design may be achieved.

As discussed, conventional circuit design implementation techniques implement the placement phase of a design flow and, subsequent thereto, identify any timing critical paths. In doing so, a significant amount of time is consumed. For example, placement is initially run and must be re-run one or more additional times once timing critical paths are addressed. Also, the troubleshooting process undertaken by designers can be time consuming. Further, efforts to fix the timing critical paths tend to be applied on a per-net basis. That is, a designer often tries to address a particular timing critical path and, upon fixing the timing critical path, may introduce a timing issue on another path of the circuit design. This piecemeal approach only serves to consume more design time and more implementation tool runtime.

In accordance with the inventive arrangements described within this disclosure, a system is capable of evaluating a circuit design prior to placement thereof to identify particular nets such as synchronous inter-clock data paths. The system is capable of creating groups of clock signals derived from the clock signals used to clock endpoints of the synchronous inter-clock data paths. Prior to performing placement, the system imposes a clock constraint on clock signals of the same group. The clock constraints force the implementation tools, e.g., a placer, to use a common, or same, location for the clock root of each respective clock signal of the same clock group. By doing so, the clock routing delays for the clock signals may be more closely matched, thereby avoiding clock skew issues on synchronous inter-clock data paths.

Use of the circuit design implementation techniques described herein results in an improved QoR for the circuit design. The resulting circuit design generally has fewer timing critical paths arising from clock skew issues, particularly with respect to synchronous inter-clock data paths. Further, the amount of implementation tool runtime is reduced since placement need not be performed iteratively. By addressing synchronous inter-clock signals in the circuit design collectively and prior to placement, as opposed to individually and post-placement, the overall QoR of the circuit design may be improved in the form of higher overall operating frequencies (e.g., faster operation) as implemented in an IC. Finally, less time is required to troubleshoot timing critical paths of the circuit design.

Further aspects of the inventive arrangements are described below with reference to the figures. For purposes of simplicity and clarity of illustration, elements shown in the figures have not necessarily been drawn to scale. For example, the dimensions of some of the elements may be exaggerated relative to other elements for clarity. Further, where considered appropriate, reference numbers are repeated among the figures to indicate corresponding, analogous, or like features.

FIG. 1 illustrates an example implementation of a data processing system 100. As defined herein, the term "data processing system" means one or more hardware systems configured to process data, each hardware system including at least one hardware processor and memory, wherein the hardware processor is programmed with computer-readable instructions that, upon execution, initiate operations. Data processing system 100 can include a hardware processor 102, a memory 104, and a bus 106 that couples various system components such as memory 104 to processor 102.

Hardware processor 102 may be implemented as one or more hardware processors. In an example, hardware processor 102 is implemented as a central processing unit (CPU). Hardware processor 102 may be implemented as one or more circuits capable of carrying out instructions contained in program code. The circuits may be implemented as an integrated circuit or embedded in an integrated circuit. Hardware processor 102 may be implemented using a complex instruction set computer architecture (CISC), a reduced instruction set computer architecture (RISC), a vector processing architecture, or other known architectures. Example hardware processors include, but are not limited to, hardware processors having an x86 type of architecture (IA-32, IA-64, etc.), Power Architecture, ARM processors, and the like.

Bus 106 represents one or more of any of a variety of communication bus structures. By way of example, and not limitation, bus 106 may be implemented as a Peripheral Component Interconnect Express (PCIe) bus.

Data processing system 100 typically includes a variety of computer system readable media. Such media may include computer-readable volatile and non-volatile media and computer-readable removable and non-removable media. In the example, memory 104 includes computer-readable media in the form of volatile memory, such as random-access memory (RAM) 108 and/or cache memory 110. Data processing system 100 also can include other removable/non-removable, volatile/non-volatile computer storage media. By way of example, storage system 112 can be provided for reading from and writing to a non-removable, non-volatile magnetic and/or solid-state media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 106 by one or more data media interfaces. Memory 104 is an example of at least one computer program product.

Memory 104 is capable of storing computer-readable program instructions that are executable by hardware processor 102. For example, the computer-readable program instructions can include an operating system, one or more application programs, other program code, and program data. In the example, the computer-readable program instructions can include an Electronic Design Automation (EDA) framework 120. In one or more example implementations, EDA framework 120 is capable of performing a design flow. A design flow refers to a multi-phase process that typically includes synthesis, placement, and routing. In general, synthesis refers to the process of generating a gate-level netlist from a high-level description of a circuit or system. The netlist may be technology specific in that the netlist is intended for implementation in a particular IC referred to as a "target IC." Placement refers to the process of assigning elements of the synthesized circuit design to particular instances of circuit blocks and/or resources having specific locations on the target IC. Routing refers to the process of selecting or implementing particular routing resources, e.g., wires and/or other interconnect circuitry, to electrically couple the various circuit blocks of the target IC after placement. The resulting circuit design, e.g., circuit design 122, having been processed through the design flow by EDA framework 120, may be physically realized, e.g., implemented, within an IC 124.

Hardware processor 102, in executing the computer-readable program instructions, is capable of performing the various operations described herein that are attributable to a computer. It should be appreciated that data items used, generated, and/or operated upon by data processing system 100 are functional data structures that impart functionality when employed by data processing system 100. As defined within this disclosure, the term “data structure” means a physical implementation of a data model's organization of data within a physical memory. As such, a data structure is formed of specific electrical or magnetic structural elements in a memory. A data structure imposes physical organization on the data stored in the memory as used by an application program executed using a hardware processor.

IC 124 may be implemented as any of a variety of different types of ICs. For example, IC 124 may be implemented as a System-on-Chip (SoC), an Application-Specific IC (ASIC), an adaptive IC (e.g., a programmable IC such as a Field Programmable Gate Array (FPGA)), or the like. An adaptive IC is an IC that may be updated subsequent to deployment of the device into the field. An adaptive IC may be optimized, e.g., configured or reconfigured, for performing particular operations after deployment. The optimization may be performed repeatedly over time to meet different requirements or needs. A programmable IC includes any IC that includes at least some programmable circuitry. Examples of programmable circuitry include programmable logic and/or FPGA circuitry.

Data processing system 100 may include one or more Input/Output (I/O) interfaces 118 communicatively linked to bus 106. I/O interface(s) 118 allow data processing system 100 to communicate with one or more external devices and/or communicate over one or more networks such as a local area network (LAN), a wide area network (WAN), and/or a public network (e.g., the Internet). Examples of I/O interfaces 118 may include, but are not limited to, network cards, modems, network adapters, hardware controllers, etc. Examples of external devices also may include devices that allow a user to interact with data processing system 100 (e.g., a display, a keyboard, and/or a pointing device) and/or other devices such as a circuit board or card on which IC 124 may be disposed.

Data processing system 100 is only one example implementation of computer hardware. Data processing system 100 can be practiced as a standalone device (e.g., as a user computing device or a server, as a bare metal server), in a cluster (e.g., two or more interconnected computers), or in a distributed cloud computing environment (e.g., as a cloud computing node) where tasks are performed by remote processing devices that are linked through a communications network. In a distributed cloud computing environment, program modules may be located in both local and remote computer system storage media including memory storage devices.

Figure 2:
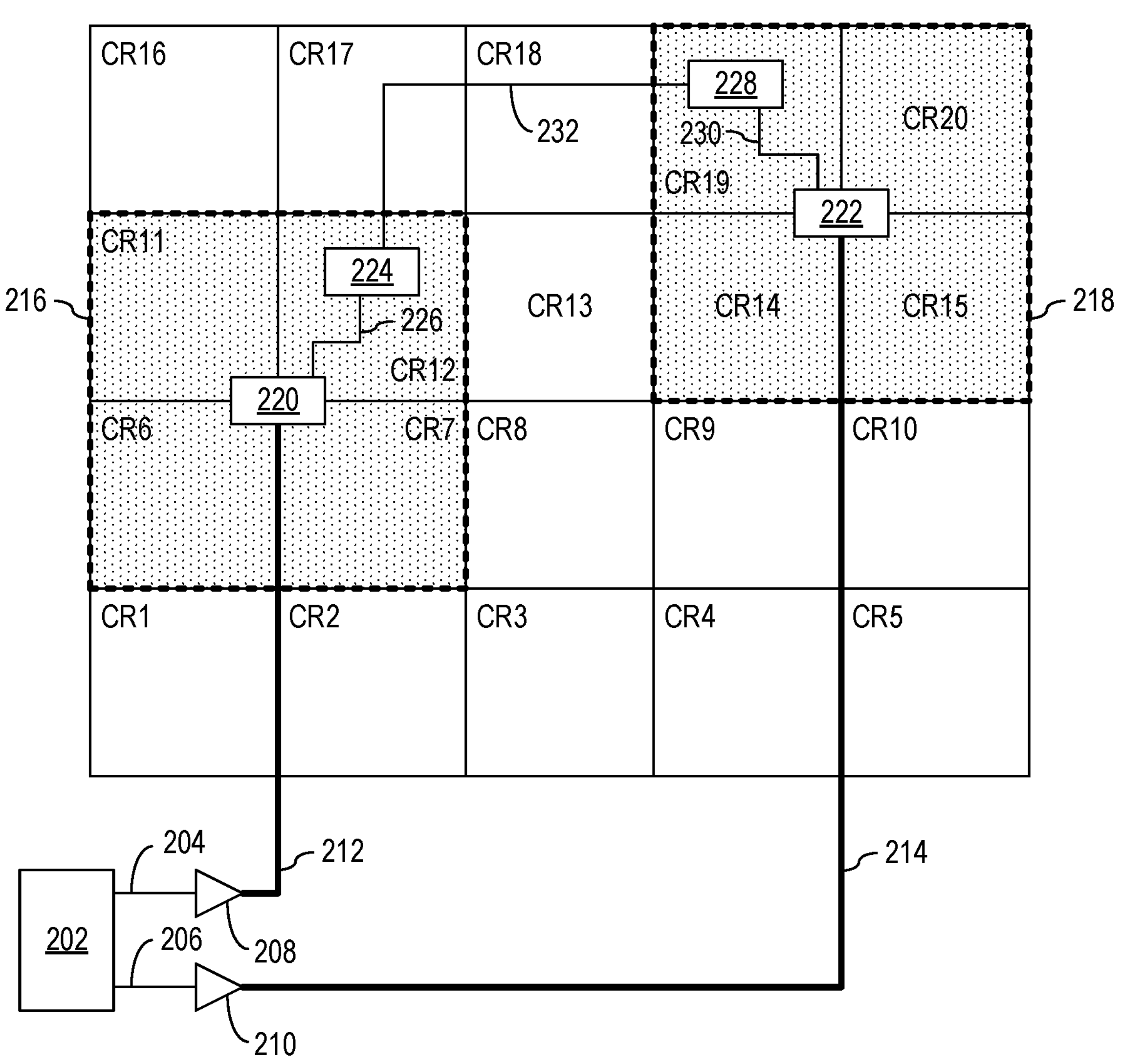
FIG. 2 illustrates an example of an integrated circuit including a synchronous inter-clock data path.

FIG. 2 illustrates an example of IC 124 of FIG. 1. In the example of FIG. 2, EDA framework 120 has performed placement on circuit design 122 without first taking actions that address clock skew issues for synchronous inter-clock data paths resulting in the placement shown. As illustrated, IC 124 includes a plurality of clock regions (CR) 1-20. In some cases, clock regions may be identified using an (x, y) coordinate system. For ease of illustration, clock regions are numbered herein from 1 to 20.

IC 124 includes one or more clock generators such as clock generator 202. Clock generator 202 is capable of generating a plurality of different clock signals. For example, clock generator 202 may a phase-locked loop circuit, mixed mode clock signal circuit, or the like, capable of generating one or more clock signals from a given reference signal. The particular type of circuit used to generate clock signals is not intended as a limitation of the inventive arrangements. Rather, any appropriate clock generation circuitry may be used. In the example of FIG. 2, clock generator generates two different clock signals 204 and 206. In other example implementations, clock generator 202 is capable of generating more than two clock signals. In this regard, the inventive arrangements are not intended to be limited by the particular number of clock generators and/or clock signals generated by clock generator 202. In any case, clock signal 204 may have a first frequency, while clock signal 206 has a second and different frequency.

Clock signal 204 is provided to clock buffer 208. Clock signal 206 is provide to clock buffer 210. In the example, it can be seen that clock signal 204 and clock signal 206 have a common ancestor clock node which is clock generator 202. In this regard, clock signals 204 and 206 may be considered synchronous as each is generated or derived from a same source (e.g., a reference signal that may be provided to clock generator 202 which is not shown).

In the example, clock buffers 208, 210 may be disposed at the same general location of IC 124. That is, for practical purposes, clock buffers 208, 210 may be located close enough to one another so as to be considered to have a common or same location.

The architecture of IC 124 may include a variety of different clock resources. Several of these resources such as clock generator 202 and clock buffers 208, 210 have been noted. In the example, each of clock buffers 208, 210 drives a clock routing line. For example, clock buffer 208 drives clock routing line 212. Clock buffer 210 drives clock routing line 214. In the example, each of clock routing lines 212, 214 may represent a plurality of different tracks. Each track is a separate clock line capable of carrying or conveying a different clock signal.

Other clock resources include clock distribution lines. A clock distribution line, like a clock routing line, also includes a plurality of tracks. Each track of a clock distribution line is capable of carrying or conveying a different clock signal. The tracks of clock distribution lines convey clock signals to clock loads. A clock load is a component that is clocked by a given clock signal.

In general, clock routing lines may traverse different regions of IC 124 to a particular or selected point at which a clock signal may be conveyed from a track of the clock routing line to a track of a clock distribution line. A clock routing line (e.g., any of the tracks thereof) is configured to route a clock signal from a clock buffer to a central location or point from which the clock routing line connects to a track of a clock distribution line that connects to the clock loads. In this regard, the clock signal may be conveyed from a track of a clock routing line to a track of a clock distribution line to the particular components clocked by the respective clock signal.

In the example of FIG. 2, clock regions CR6, CR7, CR11, and CR12 form, or are included in, an expansion window

216. Clock regions CR14, CR15, CR19, and CR 20 form, or are included in, an expansion window 218. Within this disclosure, the term "expansion window" refers to a bounding box that is drawn around, or that encompasses, each component that is clocked by a given clock signal. In the example, the expansion windows are drawn along the boundaries of the clock regions. Expansion window 216, for example, will include each clock load (e.g., circuit component) that is clocked by clock signal 204. Expansion window 218 includes each clock load of clock signal 206.

In the example, expansion window 216 has a clock root 220. Expansion window 218 has a clock root 222. A clock root is the point at which a given clock signal transitions from a clock routing line to a clock distribution line. Referring to expansion window 216, component 224 is clocked by clock signal 204. Clock root 220 denotes the point at which clock signal 204 transitions from a track of clock routing line 212 to a track of clock distribution line 226 that connects to component 224. Referring to expansion window 218, component 228 is clocked by clock signal 206. Clock root 222 denotes the point at which clock signal 206 transitions from a track of clock routing line 214 to a track of clock distribution line 230 that connects to component 228. For purposes of illustration, only components 224 and 228 are illustrated. It should be appreciated, however, that each of clock signals 204, 206 may clock hundreds or thousands of components (not shown) included in expansion windows 216, 218, respectively.

In the example, during placement, the placer of EDA framework 120 is tasked with defining the expansion window for each clock signal and also selecting the clock root for the expansion window. In many cases, the placer selects a point at or near the center of the expansion window for each respective clock signal. In the example of FIG. 2, it can be seen that components 224 and 228 are connected by a data path 232 (e.g., a data signal—to be differentiated from a clock signal). In this regard, the net formed of component 224, data path 232, and component 228 is an example of a synchronous inter-clock signal path. Each endpoint of the net is clocked by a different clock signal and the two clock signals used to clock the net have a common or same clock ancestor node. It should be appreciated that expansion window 216 and expansion window 218 may have more than one net that is a synchronous inter-clock data path traversing between the expansion windows.

In the example of FIG. 2, the placer's decision to locate the clock root of each of clock signals 204, 206 at the center of the respective expansion windows 216, 218 may cause clock skew issues for the synchronous inter-clock data path. The clock delays are generally measured from clock buffer 208 to clock root 220 and from clock buffer 210 to clock root 222. In the example, clock skew issues may arise resulting in the net formed of components 224, 228 and data path 232 being timing critical. As illustrated, the clock delay for clock signal 206 exceeds that of clock signal 204. In not taking steps prior to placement to address clock skew issues for synchronous inter-clock data paths, there is a higher likelihood that synchronous inter-clock data paths between expansion window 216 and expansion window 218 will be timing critical. Fixing the data paths will require time troubleshooting the circuit design, re-running the implementation tools (e.g., the placer), and may cause other data paths to become timing critical.

Figure 3:
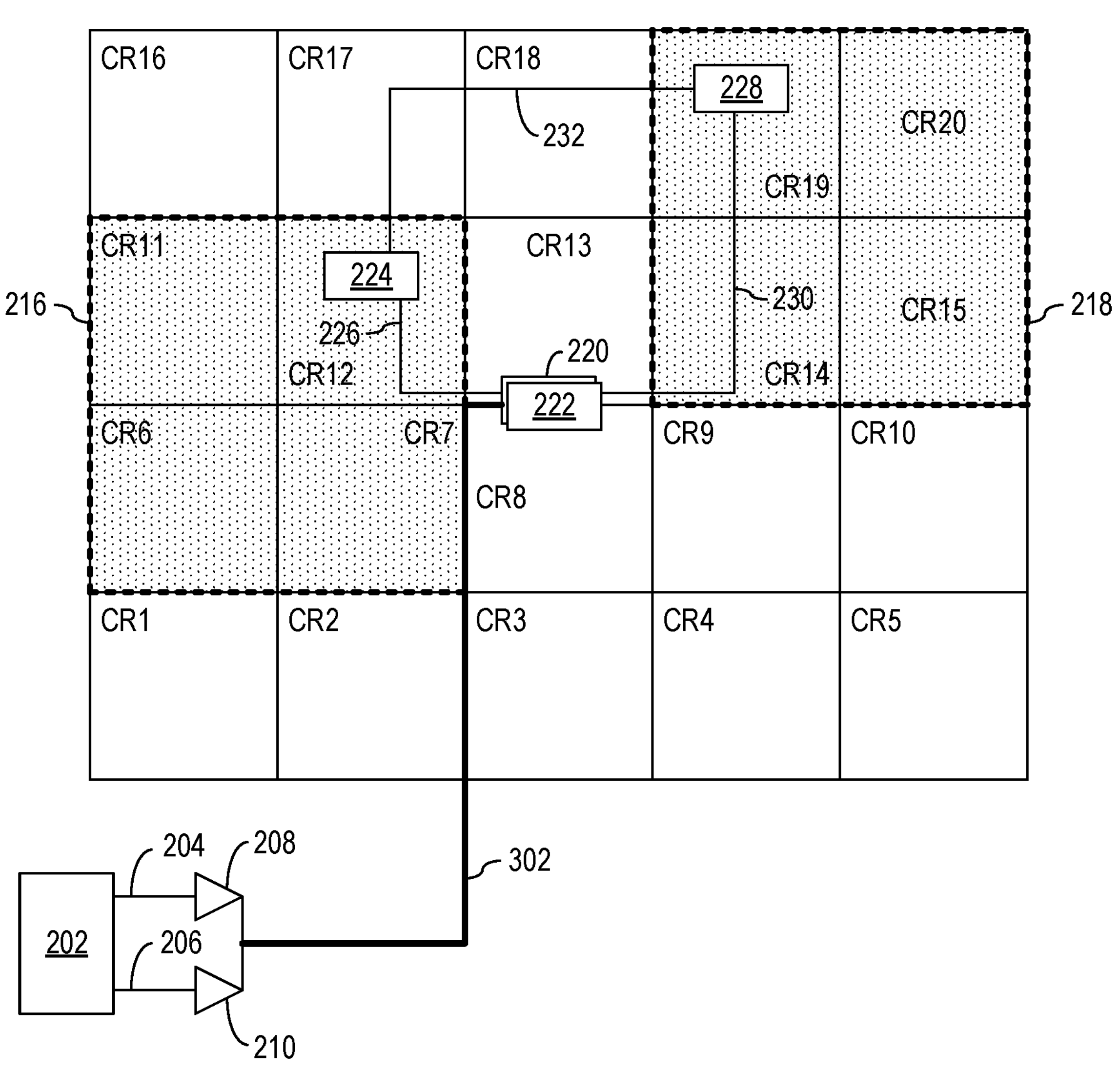
FIG. 3 illustrates another example of the integrated circuit of FIG. 2 in which a preplacement clock processing technique is applied.

FIG. 3 illustrates another example of IC 124 of FIG. 1. In the example of FIG. 3, EDA framework 120 has, prior to performing placement, taken certain actions to avoid timing criticality of synchronous inter-clock data paths. The example of FIG. 3 illustrates the effect of taking such measures prior to performing placement on circuit design 122 to result in the placement shown. In the example, the placer has set a clock delay group property for each of clock signals 204 and 206 that forces the placer to locate the clock roots 220, 222 of clock signals 204, 206, respectively, in a same location. As illustrated, clock roots 220, 222 are located at a same location.

For example, each of clock signals 204 and 206 may traverse from their respective clock buffers 208, 210 through a same clock routing line 302 (e.g., on different tracks of clock routing line 302) to their respective clock roots 220, 222. Clock signal 204 exits clock routing line 302 from clock root 220 to clock distribution line 226 to clock component 224. Clock signal 206 exits clock routing line 302 from clock root 222 to clock distribution line 230 to clock component 228. In the example, the clock delay for each of clock signals 204, 206 is similar if not the same as each of clock signals 204, 206 traverses from the respective clock buffer 208, 210 through the same clock routing line 302 to clock roots 220, 222, respectively. Though not shown in detail, it should be appreciated that each of clock roots 220, 222 are not identical points, but rather junctions between the tracks of clock routing line 302 and the tracks of clock distribution lines 226 and 230. That is, clock root 220 represents the junction between the track of clock routing line 302 that conveys clock signal 204 and the track of clock distribution line 226 that conveys clock signal 204. Similarly, clock root 220 represents the junction between the track of clock routing line 302 that conveys clock signal 206 and the track of clock distribution line 230 that conveys clock signal 206.

Figure 4:
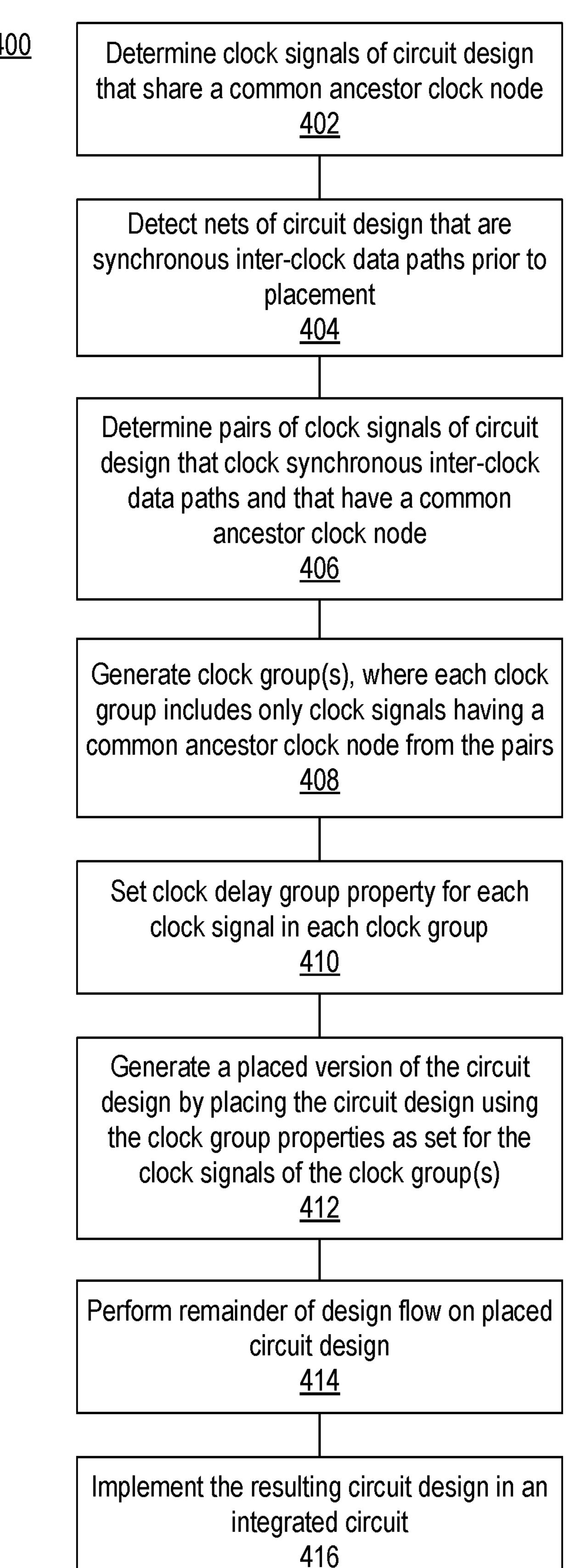
FIG. 4 illustrates an example method of implementing a circuit design in accordance with the inventive arrangements described within this disclosure.

FIG. 4 illustrates an example method 400 of implementing a circuit design in accordance with the inventive arrangements described within this disclosure. Method 400 may be performed by EDA framework 120 as an automated process as executed by data processing system 100 or another suitable computer. For purposes of description, method 400 may begin in a state where the system (e.g., in reference to data processing system 100 or other suitable computer executing EDA framework 120 as described) has received a circuit design, e.g., a user circuit design. The system may begin performing a design flow on the circuit design. In this example, the circuit design may have been synthesized by the system and not yet placed and not yet routed. In this regard, it should be appreciated that blocks 402-410 represent operations performed by the system that occur prior to the placement phase.

In block 402, the system determines clock signals of the circuit design that share a common ancestor clock node. For example, the system identifies clock signals that are used by the circuit design, where the clock signals are generated by a same clock generator. For purposes illustration, the system identifies clock signals 204 and 206 as clock signals that share a common ancestor clock node. If, for example, clock generator 202 generates more clock signals than clock signals 204, 206 that are used by the circuit design, the system would recognize such other clocks signals as also sharing a same clock ancestor node as clock signals 204, 206.

In block 404, the system detects nets of the circuit design that are synchronous inter-clock data paths. Referring to the example of FIGS. 2 and 3, the system would recognize the net formed of components 224, 228 and of data path 232 as a synchronous inter-clock data path. It should be appreciated that the system may detect many such nets within the circuit design. Further, such nets may be driven by different clock signals than illustrated and span different expansion windows than illustrated.

In block 406, the system determines pairs of clock signals of the circuit design that clock synchronous inter-clock data paths and that have a common ancestor clock node. In block 406, having identified clock signals that share a common ancestor clock node and the synchronous inter-clock data paths of the circuit design, the system is capable of generating one or more pairs of clock signals. As noted, each of clock signal of a given pair of clock signals drives, or clocks, endpoints of a same synchronous inter-clock data path. Further, each pair of clock signals shares a common ancestor clock node. That is, each pair of clock signals includes a first clock signal such as clock signal 204 that is configured to clock a first endpoint of a net (e.g., component 224) and a second clock signal such as clock signal 206 that is configured to clock a second endpoint of the (same) net (e.g., component 228). The common ancestor clock node for clock signals 204, 206, for purposes of illustration, is clock generator 202.

In block 408, the system generates one or more clock groups, where each clock group includes only clock signals having a common ancestor clock node from the pairs. Referring to the example of FIGS. 2 and 3, the system may create a clock group that includes clock signals 204 and 206. If, for example, clock generator 202 outputs one or more other clocks in addition to clock signals 204 and 206, and those clock signals were used to clock an endpoint of other synchronous inter-clock data paths that had an endpoint driven by clock signal 204 or clock signal 206, then the system would include such other clock signals in the same clock group as clock signals 204 and 206. Continuing with the example, if the other clock signal generated by clock generator 202 did not drive an endpoint of a net having another endpoint clocked by clock signal 204 or 206, however, then that clock signal would not be included in the same clock group as clock signals 204, 206. In other words, the system would exclude or omit the clock signal from the clock group including clock signals 204, 206.

In block 410, the system sets a clock constraint referred to herein as a clock delay group property for each clock signal each of the clock groups generated in block 408. Continuing with the prior example, the system sets a clock delay group property for the clock group including clock signals 204 and 206. For each of the clock signals in the same clock group, the system sets the clock delay group property. This action forces the system to use a common or same location for the clock root of each respective clock signal (e.g., clock signals 204, 206 in this example) in the same clock group. Thus, rather than putting the clock root for each of clock signals 204, 206 at the center of the expansion window for each respective clock signal, the clock roots are placed at a same location (e.g., within a predetermined distance of one another).

In block 412, the system generates a placed version of the circuit design by placing the circuit design using the delay group properties as set for the clock signals of the respective clock group(s). During placement, the system is capable of matching clock routing delays for the clock signals of the clock group based on the respective clock roots of the clock signals of the clock group. As noted, the clock routing delays are measured between a clock buffer for each clock signal and the clock root for each clock signal. That is, those clock signals in a same clock group will have clock delays that are substantially similar to one another, if not the same, since the clock signals of the clock group will traverse a common path using different tracks of a same clock routing line to reach the common location of the respective clock roots. From the respective clock roots, the clock signals exit the clock routing line to respective clock distribution lines to continue to their respective clock loads.

In block 414, the system is capable of performing the remainder of the design flow on the placed circuit design. For example, the system may perform routing. The system may also generate configuration data, e.g., a configuration bitstream. In block 416, the system, or another suitable system, is capable of implementing the circuit design, as placed and routed, in an IC. For example, the system may load the configuration data into the IC to physically realize the circuit design, as placed and routed, in the IC.

Figure 5:
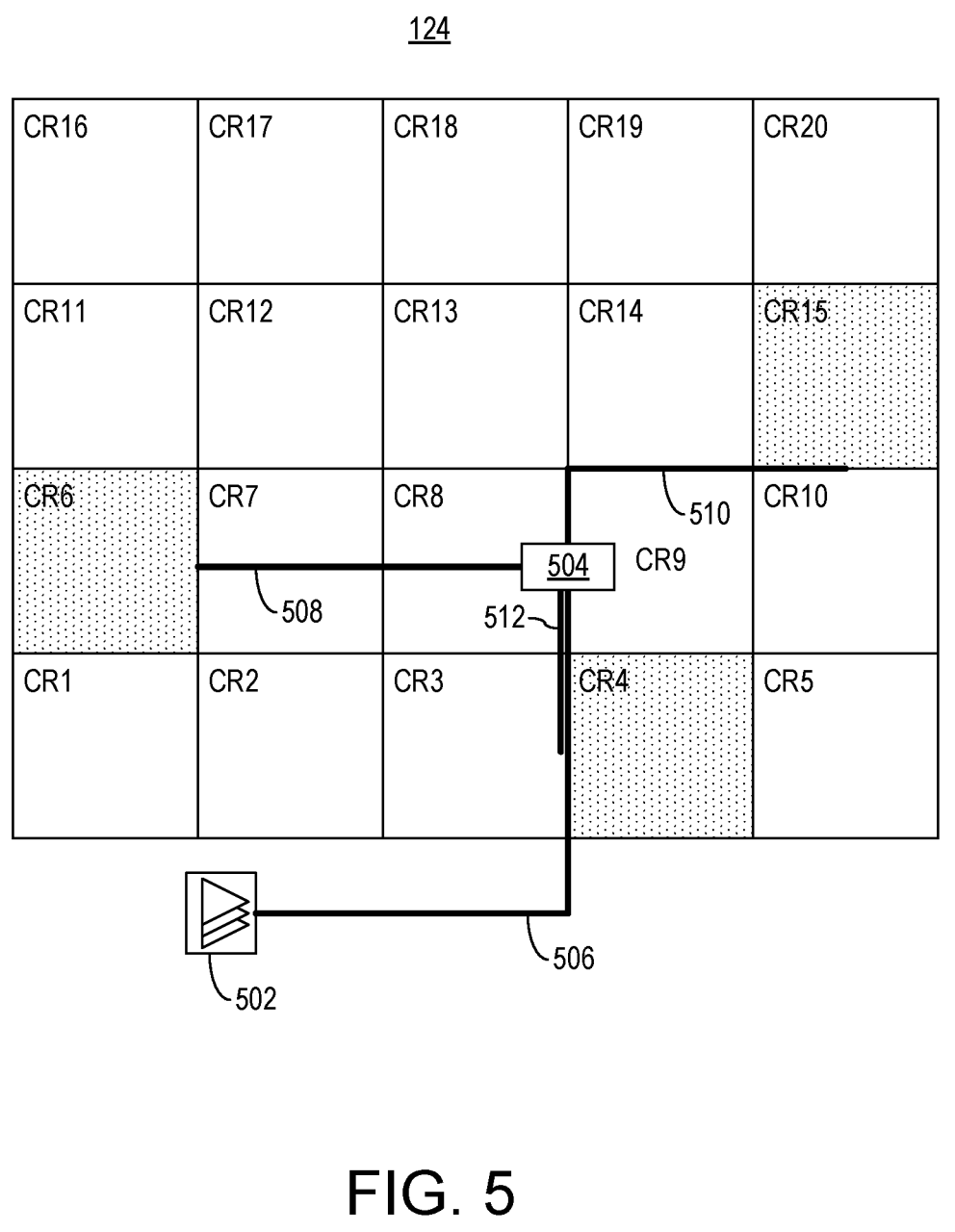

FIG. 5 illustrates another example of IC 124 of FIG. 1. In the example of FIG. 5, three clock expansion windows are illustrated corresponding to three different clock signals. Each clock expansion window is the size of a single clock region. Thus, for example, CR4 includes each component clocked by a first clock signal (e.g., all clock loads of the first clock signal), CR6 includes each component clocked by a second clock signal (e.g., all clock loads of the second clock signal), and CR15 includes each component clocked by a third clock signal (e.g., all clock loads of the third clock signal). In the example, the three clock signals have been assigned to a same clock group in which the clock delay group property of each clock signal has been set. This causes the system to select a same location for the clock root for each of the three clock signals illustrated by block 504. Though not illustrated in the example, it should be appreciated that synchronous inter-clock data paths exist between CR6 and CR15 and between CR6 and CR4. Other combinations of synchronous inter-clock data paths may exist than those examples provided (e.g., between CR4 and CR6 and between CR4 and CR15, between CR4 and CR15 and between CR15 and CR6, etc.).

In the example, block 502 illustrates three different clock buffers from which the three clock signals are conveyed over different tracks of clock routing line 506. As discussed, the three buffers may be located at a same location or within a predetermined distance from one another as each of the three clock signals is generated by the same clock generator. In the example, each of the three clock signals traverses a different track of clock routing line 506 to a respective clock root located at block 504 (e.g., block 504 indicates a location at which multiple clock roots—three in this example—are located). At the location indicated by block 504, the first clock signal traverses from a track of clock routing line 506 to a track of clock distribution line 508 to CR6. At the location indicated by block 504, the second clock signal traverses from a different track of clock routing line 506 to a track of clock distribution line 510 to CR15. At the location indicated by block 504, the third clock signal traverses from yet another track of clock routing line 506 to a track of clock distribution line 512 to CR4. In the example, the likelihood of clock skew issues causing one or more of the synchronous inter-clock nets traversing between CR4, CR6, and/or CR15 is significantly reduced due to the matched clock routing delays.

The terminology used herein is for the purpose of describing particular embodiments only and is not intended to be limiting. Notwithstanding, several definitions that apply throughout this document are expressly defined as follows.

As defined herein, the singular forms "a," "an," and "the" are intended to include the plural forms as well, unless the context clearly indicates otherwise.

As defined herein, the term “approximately” means nearly correct or exact, close in value or amount but not precise. For example, the term “approximately” may mean that the recited characteristic, parameter, or value is within a predetermined amount of the exact characteristic, parameter, or value.

As defined herein, the terms “at least one,” “one or more,” and “and/or,” are open-ended expressions that are both conjunctive and disjunctive in operation unless explicitly stated otherwise. For example, each of the expressions “at least one of A, B, and C,” “at least one of A, B, or C,” “one or more of A, B, and C,” “one or more of A, B, or C,” and “A, B, and/or C” means A alone, B alone, C alone, A and B together, A and C together, B and C together, or A, B and C together.

As defined herein, the term “automatically” means without human intervention.

As defined herein, the term “computer-readable storage medium” means a storage medium that contains or stores program instructions for use by or in connection with an instruction execution system, apparatus, or device. As defined herein, a “computer-readable storage medium” is not a transitory, propagating signal per se. The various forms of memory, as described herein, are examples of computer-readable storage media. A non-exhaustive list of examples of computer-readable storage media include an electronic storage device, a magnetic storage device, an optical storage device, an electromagnetic storage device, a semiconductor storage device, or any suitable combination of the foregoing. A non-exhaustive list of more specific examples of a computer-readable storage medium may include: a portable computer diskette, a hard disk, a RAM, a read-only memory (ROM), an erasable programmable read-only memory (EPROM or Flash memory), an electronically erasable programmable read-only memory (EEPROM), a static random-access memory (SRAM), a portable compact disc read-only memory (CD-ROM), a digital versatile disk (DVD), a memory stick, a floppy disk, or the like.

As defined herein, the term “if” means “when” or “upon” or “in response to” or “responsive to,” depending upon the context. Thus, the phrase “if it is determined” or “if [a stated condition or event] is detected” may be construed to mean “upon determining” or “in response to determining” or “upon detecting [the stated condition or event]” or “in response to detecting [the stated condition or event]” or “responsive to detecting [the stated condition or event]” depending on the context.

As defined herein, the term “responsive to” and similar language as described above, e.g., “if,” “when,” or “upon,” means responding or reacting readily to an action or event. The response or reaction is performed automatically. Thus, if a second action is performed “responsive to” a first action, there is a causal relationship between an occurrence of the first action and an occurrence of the second action. The term “responsive to” indicates the causal relationship.

As defined herein, the terms “individual” and “user” each refer to a human being.

As defined herein, the term “hardware processor” means at least one hardware circuit. The hardware circuit may be configured to carry out instructions contained in program code. The hardware circuit may be an integrated circuit. Examples of a hardware processor include, but are not limited to, a central processing unit (CPU), an array processor, a vector processor, a digital signal processor (DSP), a field-programmable gate array (FPGA), a programmable logic array (PLA), an application specific integrated circuit (ASIC), programmable logic circuitry, and a controller.

As defined herein, the terms “one embodiment,” “an embodiment,” “in one or more embodiments,” “in particular embodiments,” or similar language mean that a particular feature, structure, or characteristic described in connection with the embodiment is included in at least one embodiment described within this disclosure. Thus, appearances of the aforementioned phrases and/or similar language throughout this disclosure may, but do not necessarily, all refer to the same embodiment.

As defined herein, the term “substantially” means that the recited characteristic, parameter, or value need not be achieved exactly, but that deviations or variations, including for example, tolerances, measurement error, measurement accuracy limitations, and other factors known to those of skill in the art, may occur in amounts that do not preclude the effect the characteristic was intended to provide.

The terms first, second, etc. may be used herein to describe various elements. These elements should not be limited by these terms, as these terms are only used to distinguish one element from another unless stated otherwise or the context clearly indicates otherwise.

A computer program product may include a computer-readable storage medium (or media) having computer-readable program instructions thereon for causing a processor to carry out aspects of the inventive arrangements described herein. Within this disclosure, the term “program code” is used interchangeably with the term “program instructions.” Computer-readable program instructions described herein may be downloaded to respective computing/processing devices from a computer-readable storage medium or to an external computer or external storage device via a network, for example, the Internet, a LAN, a WAN and/or a wireless network. The network may include copper transmission cables, optical transmission fibers, wireless transmission, routers, firewalls, switches, gateway computers and/or edge devices including edge servers. A network adapter card or network interface in each computing/processing device receives computer-readable program instructions from the network and forwards the computer-readable program instructions for storage in a computer-readable storage medium within the respective computing/processing device.

Computer-readable program instructions for carrying out operations for the inventive arrangements described herein may be assembler instructions, instruction-set-architecture (ISA) instructions, machine instructions, machine dependent instructions, microcode, firmware instructions, or either source code or object code written in any combination of one or more programming languages, including an object-oriented programming language and/or procedural programming languages. Computer-readable program instructions may include state-setting data. The computer-readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a LAN or a WAN, or the connection may be made to an external computer (for example, through the Internet using an Internet Service Provider). In some cases, electronic circuitry including, for example, programmable logic circuitry, an FPGA, or a PLA may execute the computer-readable program instructions by utilizing state information of the computer-readable program instructions to personalize the electronic circuitry, in order to perform aspects of the inventive arrangements described herein.

Certain aspects of the inventive arrangements are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, may be implemented by computer-readable program instructions, e.g., program code.

These computer-readable program instructions may be provided to a processor of a computer, special-purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer-readable program instructions may also be stored in a computer-readable storage medium that can direct a computer, a programmable data processing apparatus, and/or other devices to function in a particular manner, such that the computer-readable storage medium having instructions stored therein comprises an article of manufacture including instructions which implement aspects of the operations specified in the flowchart and/or block diagram block or blocks.

The computer-readable program instructions may also be loaded onto a computer, other programmable data processing apparatus, or other device to cause a series of operations to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various aspects of the inventive arrangements. In this regard, each block in the flowchart or block diagrams may represent a module, segment, or portion of instructions, which comprises one or more executable instructions for implementing the specified operations.

In some alternative implementations, the operations noted in the blocks may occur out of the order noted in the figures. For example, two blocks shown in succession may be executed substantially concurrently, or the blocks may sometimes be executed in the reverse order, depending upon the functionality involved. In other examples, blocks may be performed generally in increasing numeric order while in still other examples, one or more blocks may be performed in varying order with the results being stored and utilized in subsequent or other blocks that do not immediately follow. It will also be noted that each block of the block diagrams and/or flowchart illustration, and combinations of blocks in the block diagrams and/or flowchart illustration, may be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method, comprising:

prior to placement of a circuit design, determining, using computer hardware, a pair of clock signals specified by the circuit design that clocks a synchronous inter-clock data path, wherein the pair of clock signals have a common ancestor clock node;

generating, using the computer hardware, a clock group that includes the pair of clock signals;

setting, using the computer hardware, a clock delay group property for the clock signals of the clock group prior to placement, wherein the clock delay group property forces a placer to use a common location for a clock root for each clock signal of the clock group, and wherein the clock root of each clock signal is disposed between the common ancestor node and endpoints of the inter-clock data path; and generating a placed version of the circuit design by placing, using the computer hardware, the circuit design using the clock delay group property as set for the clock signals of the clock group thereby locating the clock root for each clock signal of the pair of clock signals at the common location.

2. The method of claim 1, further comprising:

detecting a net of the circuit design as the synchronous inter-clock data path.

3. The method of claim 1, wherein each pair of clock signals includes a first clock signal used to clock a first endpoint of a net and a second clock signal used to clock a second endpoint of the net.

4. The method of claim 1, wherein the setting the clock delay group property forces the common location for the clock root of each clock signal of the clock group.

5. The method of claim 4, wherein during the placing, clock routing delays for the clock signals of the clock group are matched based on the respective clock roots of the clock signals of the clock group.

6. The method of claim 5, wherein the clock routing delays are determined from a clock buffer of each clock signal to the clock root for each clock signal.

7. A system, comprising:

one or more hardware processors configured to initiate operations including:

prior to placement of a circuit design, determining a pair of clock signals specified by the circuit design that clocks a synchronous inter-clock data path, wherein the pair of clock signals have a common ancestor clock node;

generating a clock group that includes the pair of clock signals;

setting a clock delay group property for the clock signals of the clock group prior to placement, wherein the clock delay group property forces a placer to use a common location for a clock root for each clock signal of the clock group, and wherein the clock root of each clock signal is disposed between the common ancestor node and endpoints of the inter-clock data path; and generating a placed version of the circuit design by placing the circuit design using the clock delay group property as set for the clock signals of the clock group thereby locating the clock root for each clock signal of the pair of clock signals at the common location.

8. The system of claim 7, wherein the one or more hardware processors are configured to initiate operations including:

detecting a net of the circuit design as the synchronous inter-clock data path.

9. The system of claim 7, wherein each pair of clock signals includes a first clock signal used to clock a first endpoint of a net and a second clock signal used to clock a second endpoint of the net.

10. The system of claim 7, wherein the setting the clock delay group property forces the common location for the clock root of each clock signal of the clock group.

11. The system of claim 10, wherein during the placing, clock routing delays for the clock signals of the clock group are matched based on the respective clock roots of the clock signals of the clock group.

12. The system of claim 11, wherein the clock routing delays are determined from a clock buffer of each clock signal to the clock root for each clock signal.

13. A computer program product comprising one or more computer readable storage mediums having program instructions embodied therewith, wherein the program instructions are executable by computer hardware to cause the computer hardware to initiate executable operations comprising:

prior to placement of a circuit design, determining a pair of clock signals specified by the circuit design that clocks a synchronous inter-clock data path, wherein the pair of clock signals have a common ancestor clock node;

generating a clock group that includes the pair of clock signals;

setting a clock delay group property for the clock signals of the clock group prior to placement, wherein the clock delay group property forces a placer to use a common location for a clock root for each clock signal of the clock group, and wherein the clock root of each clock signal is disposed between the common ancestor node and endpoints of the inter-clock data path; and generating a placed version of the circuit design by placing the circuit design using the clock delay group property as set for the clock signals of the clock group thereby locating the clock root for each clock signal of the pair of clock signals at the common location.

14. The computer program product of claim 13, wherein the program instructions are executable by the computer hardware to cause the computer hardware to initiate executable operations comprising:

detecting a net of the circuit design as the synchronous inter-clock data path.

15. The computer program product of claim 13, wherein each pair of clock signals includes a first clock signal used to clock a first endpoint of a net and a second clock signal used to clock a second endpoint of the net.

16. The computer program product of claim 13, wherein during the placing, clock routing delays for the clock signals of the clock group are matched based on the respective clock roots of the clock signals of the clock group.

17. The computer program product of claim 16, wherein the clock routing delays are determined from a clock buffer of each clock signal to the clock root for each clock signal.

* * * * *